(12) United States Patent
Nakao et al.

(10) Patent No.: US 9,952,288 B2
(45) Date of Patent: Apr. 24, 2018

(54) BATTERY CONTROLLER

(71) Applicant: HITACHI AUTOMOTIVE SYSTEMS, LTD., Hitachinaka-shi, Ibaraki (JP)

(72) Inventors: Ryohei Nakao, Tokyo (JP); Yohei Kawahara, Tokyo (JP); Akihiko Kudou, Hitachinaka (JP); Keiichiro Ookawa, Hitachinaka (JP); Naoyuki Igarashi, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 317 days.

(21) Appl. No.: 14/765,741

(22) PCT Filed: Feb. 5, 2013

(86) PCT No.: PCT/JP2013/052547
§ 371 (c)(1),
(2) Date: Aug. 4, 2015

(87) PCT Pub. No.: WO2014/122721
PCT Pub. Date: Aug. 14, 2014

(65) Prior Publication Data
US 2015/0369873 A1 Dec. 24, 2015

(51) Int. Cl.
*G01R 31/36* (2006.01)
(52) U.S. Cl.
CPC ....... *G01R 31/3648* (2013.01); *G01R 31/362* (2013.01); *G01R 31/3606* (2013.01); *G01R 31/3624* (2013.01); *G01R 31/3679* (2013.01); *G01R 31/3658* (2013.01)

(58) Field of Classification Search
CPC ............ G01R 31/3648; G01R 31/3606; G01R 31/362; G01R 31/3624; G01R 31/3679
See application file for complete search history.

(56) References Cited

U.S. PATENT DOCUMENTS

| 2002/0196026 | A1 | 12/2002 | Kimura et al. |
| 2008/0169819 | A1 | 7/2008 | Ishii |
| 2011/0140669 | A1* | 6/2011 | Murakami ............ B60L 3/0038 320/134 |
| 2015/0236524 | A1* | 8/2015 | Takano .................. H02J 7/007 320/107 |

FOREIGN PATENT DOCUMENTS

| JP | 2000-258513 A | 9/2000 |
| JP | 2002-369391 A | 12/2002 |
| JP | 2009-190690 A | 8/2009 |
| JP | 2010135075 A | 6/2010 |
| WO | 2006/022073 A1 | 3/2006 |
| WO | 2012098968 A1 | 7/2012 |

OTHER PUBLICATIONS

Japanese Office Action for Japanese Patent Application No. 2014-560546.

* cited by examiner

*Primary Examiner* — Bryan Bui
(74) *Attorney, Agent, or Firm* — Volpe and Koenig, P.C.

(57) ABSTRACT

Provided is a battery control device which can verify a probability of a state of charge or a state of health of a battery. A battery controller according to the invention calculates a measurement parameter of the battery using the state of charge or the state of health of the battery, and the probability of the state of charge or the state of health is diagnosed by comparing the measurement results (see FIGS. 9(*a*) and 9(*b*)).

8 Claims, 12 Drawing Sheets

BATTERY CONTROLLER

TECHNICAL FIELD

The present invention relates to a device that controls batteries.

BACKGROUND ART

A battery system mounted on an electric vehicle (EV), a plug-in hybrid electric vehicle (PHEV), or a hybrid electric vehicle (HEV) includes a battery controller which detects a voltage, a temperature, and a current of the battery, and calculates a state of charge (SOC) and a state of health (SOH) of the battery based on these detected values in order to improve the performance of the battery at a maximum level while preventing overcharge/overdischarge of the battery of the battery system.

As a method of calculating the SOC of the battery, there is a current integration method in which a capacitance obtained by integrating a current value flowing in the battery and a full charge capacitance of the battery are used. As a method of calculating the SOH of the battery, there is a method in which an internal resistance value is calculated based on a ratio (dV/dI) of a change (dI) of the current flowing in the battery and a change (dV) of a battery voltage, and is compared with the internal resistance when the battery is new so as to calculate the SOH.

The SOH of the battery can be utilized as a criterion of replacement of the battery system. The following PTL 1 discloses a technology in which the SOH obtained through the calculation is compared with a predetermined threshold, and a warning lamp is lit on in a case where there is a need to replace the battery.

CITATION LIST

Patent Literature

PTL 1: JP 2002-369391 A

SUMMARY OF INVENTION

Technical Problem

In the technology disclosed in PTL 1, the accuracy of the SOH obtained through the calculation (that is, a probability of the calculation result) is not able to be diagnosed. In a case where the accuracy of the SOH calculation result is not cleared, there may be caused the warning lamp to be lit on inaccurately to urge a user to replace the battery.

The invention has been made in view of the above problems, and an object thereof is to provide a battery control device which can verify a probability of the SOC or the SOH of the battery.

Solution to Problem

A battery controller according to the invention calculates a measurement parameter of the battery using the SOC or the SOH of the battery, and diagnoses the probability of the SOC or the SOH of the battery by comparing measurement values.

Advantageous Effects of Invention

According to a battery controller of the invention, it is possible to secure reliability of the battery controller by diagnosing the probabilities of the calculation results of the SOC and the SOH. In addition, when the probabilities of the calculation results of the SOC and the SOH are lowered, it is possible to urge a user to replace the battery by notifying the situation to the user.

Purposes, configurations, and effects other than those described above will be apparent from the following description on embodiments.

DESCRIPTION OF EMBODIMENTS

Hereinafter, embodiments of the invention will be described with reference to the drawings. In the following embodiments, the description will be made about a case where the invention is applied to a battery system included in a power source of a plug-in hybrid electric vehicle (PHEV). The configurations of the embodiments in the following description can be applied to a battery control circuit of a battery apparatus included in the power source of a car such as a hybrid electric vehicle (HEV) or an electric vehicle (EV), and an industrial vehicle such as a hybrid railway vehicle.

In the following embodiments, the description will be exemplarily made about a lithium ion battery, but may be applied to other batteries such as a nickel metal hydrogen battery, a lead acid battery, an electric double layer capacitor, and a hybrid. Further, in the following embodiments, cells are connected in series to form an assembled battery, but the assembled battery may be configured by connecting parallel-connected cells in series or may be configured by connecting serially connected cells in parallel.

First Embodiment: System Configuration

Figure 1:
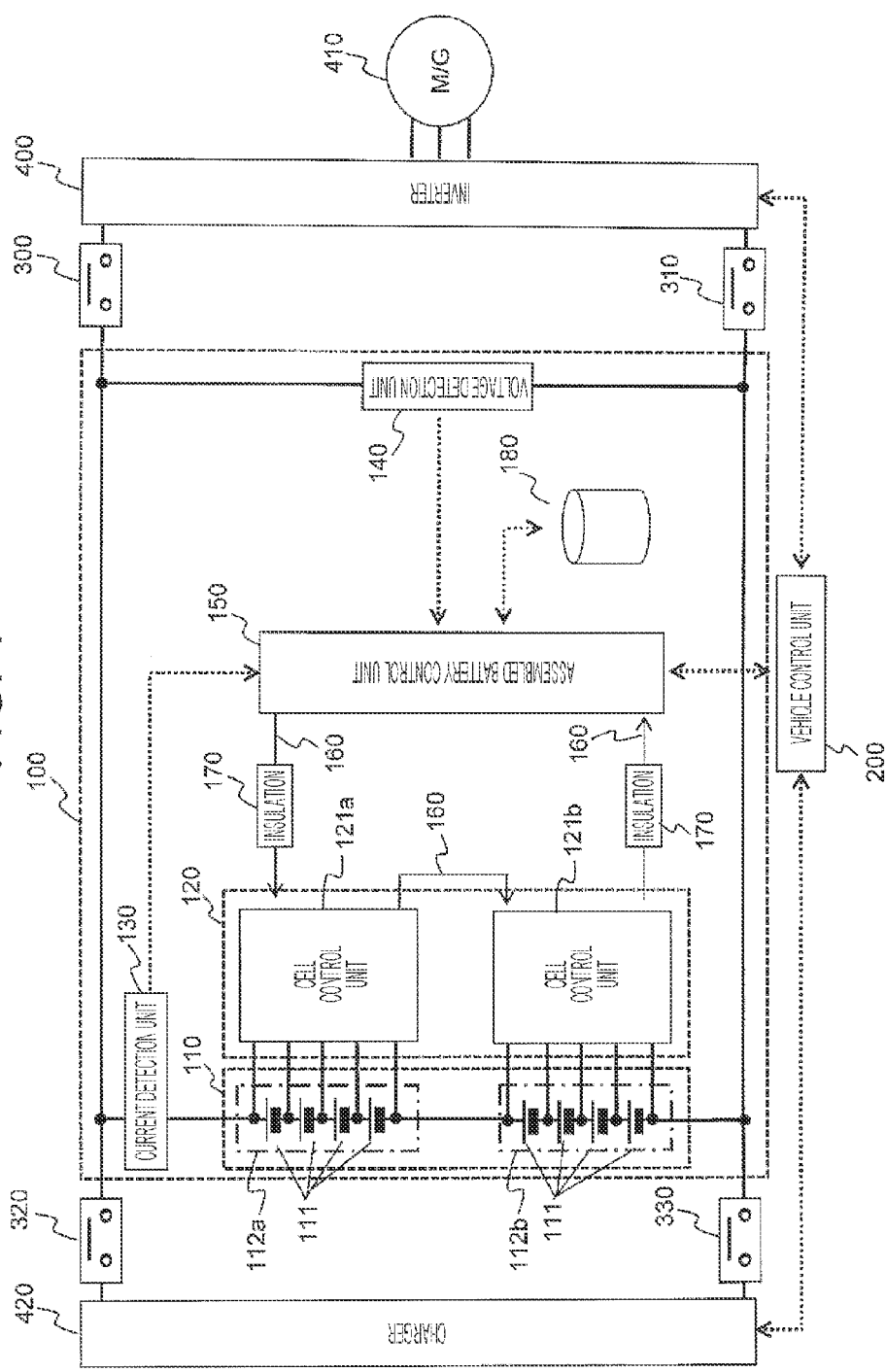
FIG. 1 is a diagram illustrating a battery system 100 and a peripheral configuration according to a first embodiment.

FIG. 1 is a diagram illustrating a battery system 100 and a peripheral configuration according to a first embodiment of the invention. The battery system 100 is connected to an inverter 400 through relays 300 and 310, and connected to a charger 420 through relays 320 and 330. The battery system 100 includes an assembled battery 110, a cell management unit 120, a current detection unit 130, a voltage detection unit 140, an assembled battery control unit 150, and a memory unit 180.

The assembled battery 110 includes a plurality of cells 111. The cell management unit 120 monitors the state of the cells 111. The current detection unit 130 detects a current flowing in the battery system 100. The voltage detection unit 140 detects a total voltage of the assembled battery 110. The assembled battery control unit 150 detects the state of the assembled battery 110, and also manages the state.

The assembled battery control unit 150 receives a voltage and a temperature of the cell 111 transmitted by the cell management unit 120, a current value flowing in the battery system 100 transmitted by the current detection unit 130, and a total voltage value of the assembled battery 110 transmitted by the voltage detection unit 140. The assembled battery control unit 150 detects the state of the assembled battery 110 based on the received information. The result on the state detected by the assembled battery control unit 150 is transmitted to the cell management unit 120 and a vehicle control unit 200.

The assembled battery 110 is configured by electrically connecting the plurality of cells 111 in series which can accumulate and release the electric energy (charging/discharging of DC power). The cells 111 included in the assembled battery 110 are divided into groups by a predetermined number of units after management/control of the state. The cells 111 divided into groups are electrically connected in series to form cell groups 112a and 112b. The number of cells 111 forming a cell group 112 may be set to be uniform in all the cell groups 112, or the number of cells 111 may be differently configured in the cell groups 112.

The cell management unit 120 monitors the state of the cells 111 included in the assembled battery 110. The cell management unit 120 includes a cell control unit 121 which is provided in each cell group 112. In FIG. 1, cell control units 121a and 121b are provided in correspondence to the cell groups 112a and 112b. The cell control unit 121 monitors and controls the state of the cells 111 forming the cell group 112.

In this first embodiment, for the sake of simplicity of the description, four cells 111 are electrically connected in series to form the cell groups 112a and 112b, and the cell groups 112a and 112b are further electrically connected in series so as to form the assembled battery 110 including eight cells 111 in total.

The assembled battery control unit 150 and the cell management unit 120 transmit and receive signals through an insulation element 170 (represented by a photocoupler) and a signal communication unit 160.

The assembled battery control unit 150 and a communication unit between the cell control units 121a and 121b forming the cell management unit 120 will be described. The cell control units 121a and 121b are connected in series to the cell groups 112a and 112b respectively in an order of a decreasing potential for the monitoring. The signal transmitted to the cell management unit 120 by the assembled battery control unit 150 is input to the cell control unit 121a through the insulation element 170 and the signal communication unit 160. The output of the cell control unit 121a is input the cell control unit 121b through the signal communication unit 160, and the output of the cell control unit 121b at the lowest potential is transferred to the assembled battery control unit 150 through the insulation element 170 and the signal communication unit 160. In this first embodiment, there is no insulation element 170 between the cell control unit 121a and the cell control unit 121b, but the signal may be transmitted or received through the insulation element 170.

The memory unit 180 includes information on the assembled battery 110, the cell 111, and the cell group 112 such as an inner resistance characteristic, a capacity at the time of full charge, a polarization voltage, a health characteristic, individual difference information, and a correspondence relation between an SOC and an open circuit voltage (OCV). Furthermore, characteristic information on the cell management unit 120, the cell control unit 121, and the assembled battery control unit 150 may be stored in advance. Even when the battery system 100 and the assembled battery control unit 150 are stopped in operation, the various types of information stored in the memory unit 180 are secured. In this embodiment, the memory unit 180 is configured to be provided in the outside of the assembled battery control unit 150 or the cell management unit 120, but the memory unit 180 may be configured to be provided in the assembled battery control unit 150 or the cell management unit 120 and store the information therein.

The assembled battery control unit 150 performs calculation to obtain the SOC, the SOH, the current/power enabling the charging/discharging of one or more cells 111 using the information acquired from the cell management unit 120, the current detection unit 130, the voltage detection unit 140, the vehicle control unit 200, and an SOC table 181 described below. Then, the assembled battery control unit 150 outputs the information to the cell management unit 120 and the vehicle control unit 200.

The vehicle control unit 200 controls the inverter 400 connected to the battery system 100 through the relays 300 and 310 using the information transmitted from the assembled battery control unit 150. In addition, the vehicle control unit 200 controls the charger 420 connected to the battery system 100 through the relays 320 and 330. During a period when the vehicle runs, the battery system 100 is connected to the inverter 400, and drives a motor generator 410 using the energy accumulated by the assembled battery 110. During the charging, the battery system 100 is connected to the charger 420, and is supplied with the power from a household power source or an electric stand so as to be charged.

The charger 420 is used when the assembled battery 110 is charged using an external power source represented by the household power source or the electric stand. In this first embodiment, the charger 420 is configured to control the charge voltage and the charge current based on an instruction from the vehicle control unit 200, but the control may be performed based on an instruction from the assembled battery control unit 150. In addition, the charger 420 may be provided in the vehicle according to the configuration of the vehicle, the performance of the charger 420, an intended purpose, and installation conditions of the external power source, and may be provided in the outside of the vehicle.

In a case where a vehicle system mounting the battery system 100 starts up and runs, the battery system 100 is connected to the inverter 400 and drives the motor generator 410 using the energy accumulated in the assembled battery 110 under the management of the vehicle control unit 200, and the assembled battery 110 is charged by the generated power by the motor generator 410 at the time of regeneration. When the vehicle including the battery system 100 is connected to the external power source represented by the household power source or the electric stand, the battery system 100 and the charger 420 are connected based on the information transmitted by the vehicle control unit 200, and the vehicle is charged until a predetermined condition is satisfied in the assembled battery 110. The energy accumulated in the assembled battery 110 by the charging is used at the next running of the vehicle, or is also used for the operation of electrical components inside or outside the vehicle. Furthermore, the energy may be released to the external power source represented by the household power source as needed.

Figure 2:
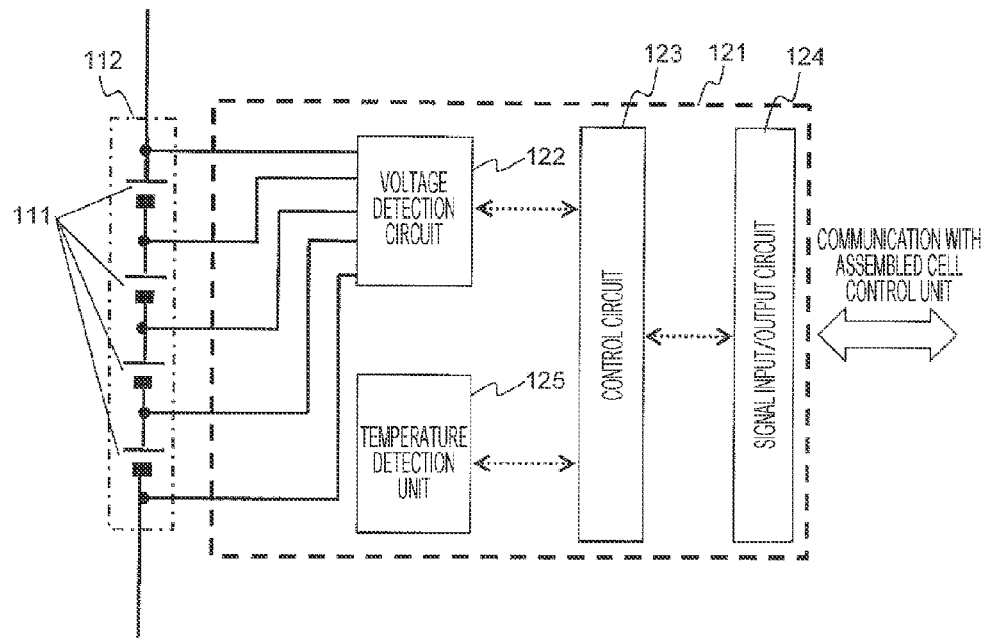
FIG. 2 is a diagram illustrating a circuit configuration of a cell control unit 121.

FIG. 2 is a diagram illustrating a circuit configuration of the cell control unit 121. The cell control unit 121 includes a voltage detection circuit 122, a control circuit 123, a signal input/output circuit 124, and a temperature detection unit 125. The voltage detection circuit 122 measures a voltage between the terminals of each cell 111. The control circuit 123 receives the measurement result from the voltage detection circuit 122 and the temperature detection unit 125, and transmits the measurement result to the assembled battery control unit 150 through the signal input/output circuit 124. Further, the circuit configuration generally installed in the cell control unit 121 and equalizing a variation of the voltage between the cells 111 and a variation of the SOC caused in accordance to a self discharge and a variation of consumption current is determined to be well known, so that the description thereof is not given herein.

The temperature detection unit 125 included in the cell control unit 121 of FIG. 2 has a function of measuring a temperature of the cell group 112. The temperature detection unit 125 measures one temperature of the cell group 112 as a whole, and uses the measured temperature as a representative value of the temperatures of the cells 111 included in the cell group 112. The temperature measured by the temperature detection unit 125 is used in various types of calculations for detecting the state of the cell 111, the cell group 112, or the assembled battery 110. FIG. 2 is, on the assumption of the above situation, illustrates one temperature detection unit 125 provided in the cell control unit 121. The temperature detection unit 125 may be provided in every cell 111 to measure the temperature of the cell 111 and various types of calculations may be performed based on the temperature of the cell 111. In this case, the configuration of the cell control unit 121 becomes complicated as the number of temperature detection units 125 is increased.

In FIG. 2, the simplified temperature detection unit 125 is illustrated. In practice, a temperature sensor is provided in a target for measuring the temperature, the provided temperature sensor outputs the temperature information as a voltage, the measurement result is transmitted to the signal input/output circuit 124 through the control circuit 123, and the signal input/output circuit 124 outputs the measurement result to the units other than the cell control unit 121. The functions for realizing a series of the flow are installed as the temperature detection unit 125 in the cell control unit 121, and the voltage detection circuit 122 may be used for the measurement of the temperature information (voltage).

Figure 3:
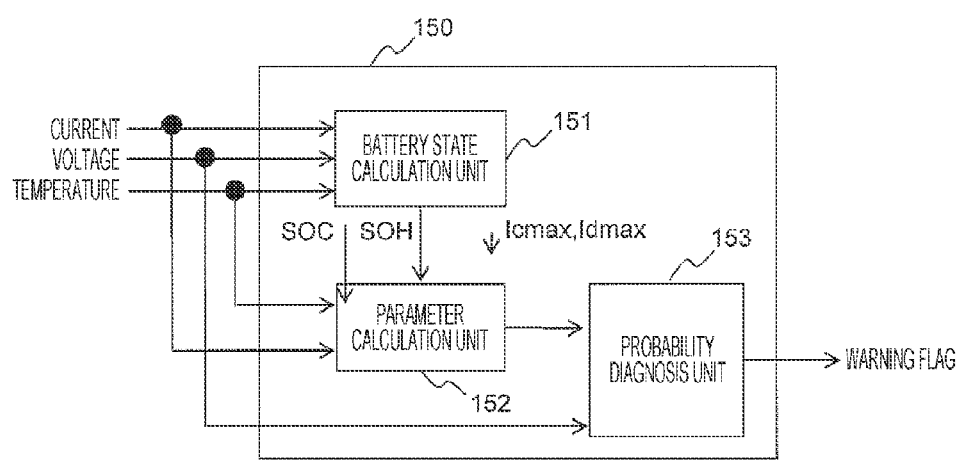
FIG. 3 is a control block diagram of an assembled battery control unit 150.

FIG. 3 is a control block diagram of the assembled battery control unit 150. The assembled battery control unit 150 includes a battery state calculation unit 151, a parameter calculation unit 152, and a probability diagnosis unit 153.

The assembled battery control unit 150 receives a both-end voltage of the cell 111 output by the cell management unit 120, a measured temperature value of the cell 111, and a battery current output by the current detection unit 130. In addition, a diagnosis result indicating whether the cell 111 is overcharged or overdischarged, an abnormality signal which is output to the cell management unit 120 when an error such as a communication error occurs, a total voltage value of the assembled battery 110 output by the voltage detection unit 140, a signal output by the vehicle control unit 200, and the like are input.

The battery state calculation unit 151 calculates the SOC and the SOH of the cell 111 using the input information, an internal resistance of the cell 111 stored by the memory unit 180 in advance, and the SOC table 181 describing a relation between the SOC and the open circuit voltage (OCV). A method of calculating the SOC and the SOH will be described below. In addition, the battery state calculation unit 151 performs a calculation for the control of voltage equalization, a calculation for the control of the amount of charging/discharging, and the like. The battery state calculation unit 151 outputs the calculation results and instructions based on these results to the cell management unit 120 and the vehicle control unit 200.

The parameter calculation unit 152 calculates the both-end voltage of the cell 111 based on the battery current value output by the current detection unit 130 and an SOC calculation result and an SOH calculation result output by the battery state calculation unit 151, and outputs the calculation result (hereinafter, referred to as a model voltage) to the probability diagnosis unit 153. In other words, the parameter calculation unit 152 does not directly measure the both-end voltage of the cell 111, but obtains the voltage of the cell 111 through the calculation. The accuracy of this calculation result depends on the calculation accuracy of the SOC and the SOH.

The probability diagnosis unit 153 has inputs of the model voltage calculated by the parameter calculation unit 152 and the both-end voltage of the cell 111 output by the cell management unit 120, and diagnoses the probability of the SOH obtained by the battery state calculation unit 151 by comparing the model voltage with the both-end voltage. The detailed diagnosis method will be described below.

Figure 4:
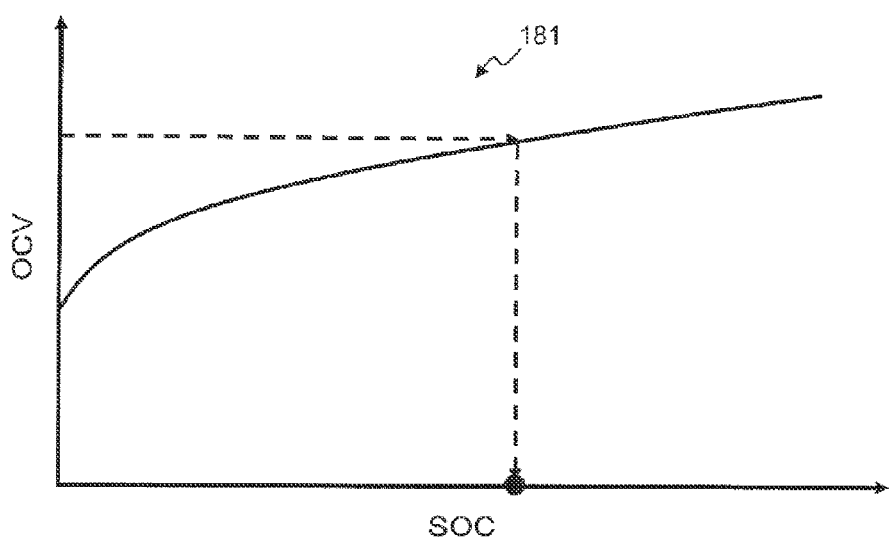
FIG. 4 is a diagram illustrating an exemplary configuration of an SOC table 181 stored by a memory unit 180.

FIG. 4 is a diagram illustrating an exemplary configuration of the SOC table 181 stored by the memory unit 180. The SOC table 181 contains data describing a correspondence relation between the OCV of the cell 111 and the SOC of the cell 111 in a format such as a table or a function.

Figure 5:
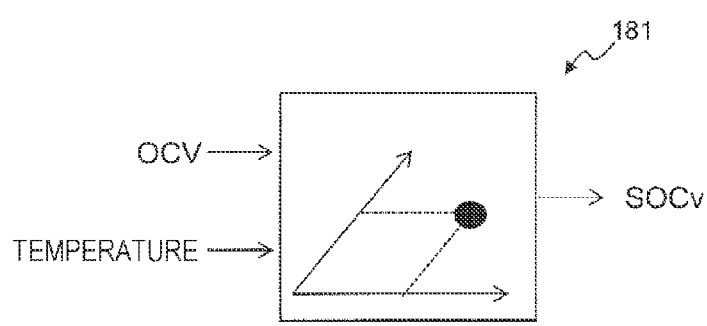
FIG. 5 is a diagram illustrating another exemplary configuration of the SOC table 181.

FIG. 5 is a diagram illustrating another exemplary configuration of the SOC table 181. The SOC table 181 may describe the correspondence relation between the OCV of the cell 111 and the SOC of the cell 111, for example, in a format such as a data table for every temperature of the cell 111.

First Embodiment: Method of Calculating SOC

Figure 6:
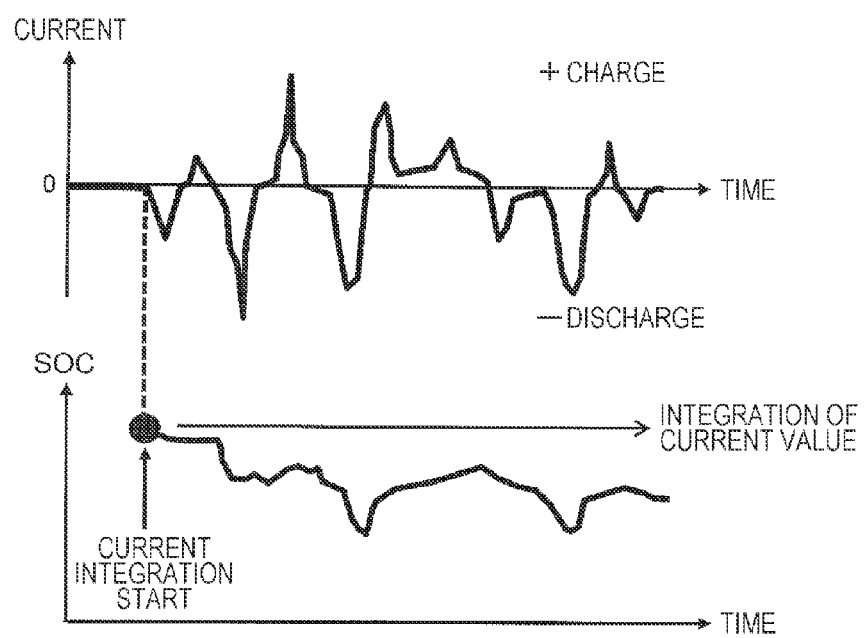
FIG. 6 is a diagram for describing another method of a battery state calculation unit 151 to calculate the SOC of a cell 111.

FIG. 6 is a diagram for describing another method of the battery state calculation unit 151 to calculate the SOC of the cell 111. The SOC of the cell 111 can be obtained by integrating the current value flowing in the assembled battery 110 based on the following Equation 1. For example, the battery state calculation unit 151 may obtain the OCV by subtracting IR drop and Vp from a closed circuit voltage CCV, and apply the OCV to the SOC table 181 to obtain the SOC of the cell 111. In this first embodiment, the final SOC of the cell 111 is assumed to be obtained through the following Equation 1.

[Mathematical Formula 1]

$$SOC(t)=SOC0+\Delta SOC(t)$$

$$SOC0=SOCMap(OCV(0),T(0))$$

$$\Delta SOC(t)=100\times(\int Ic\times\eta dt-\int Iddt)/Qmax \quad \text{Equation 1}$$

The parameter SOC0 indicates the SOC when charging/discharging starts, and is determined based on the SOC table 181 (SOCMap in Equation 1). The parameter Ic indicates a charge current [A], the parameter Id indicates a discharge current [A], the parameter Qmax indicates a full charge capacitance [Ah] of the cell 111, and the parameter $\eta$ indicates a charge efficiency.

First Embodiment: Method of Calculating SOH

Figure 7:
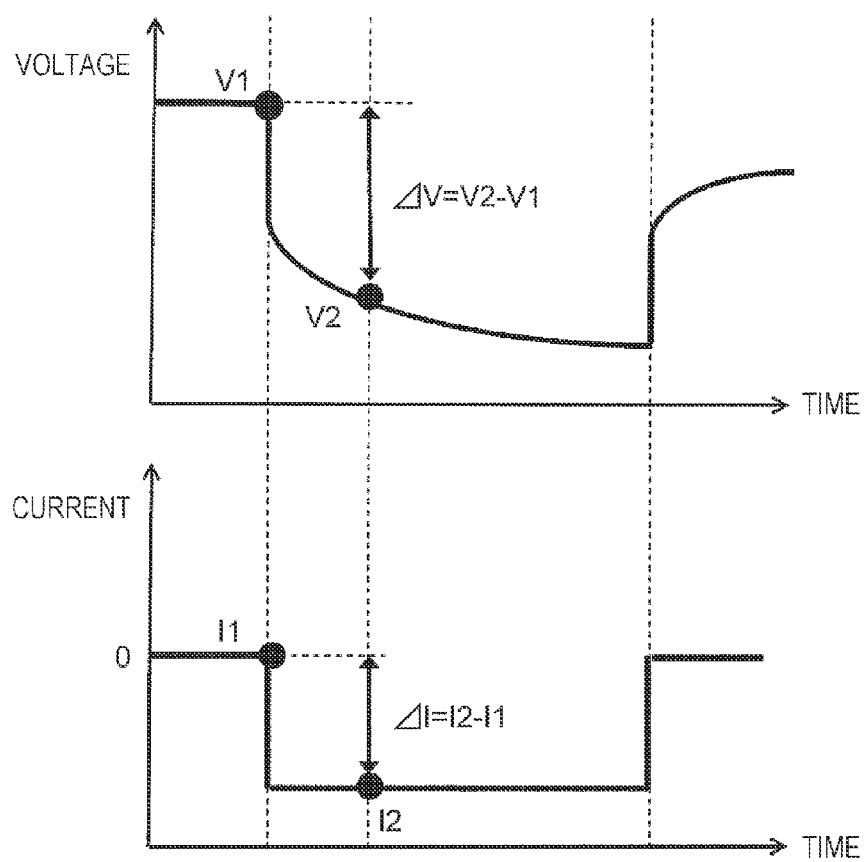
FIG. 7 is a diagram for describing a method of the battery state calculation unit 151 to calculate the SOH of the cell 111.

FIG. 7 is a diagram for describing a method of the battery state calculation unit 151 to calculate the SOH of the cell 111. The battery state calculation unit 151 defines a rate of increase in the internal resistance of the cell 111 as the SOH, and obtains the SOH through the following Equation 2.

[Mathematical Formula 2]

$$SOH=100\times R1/R0(SOC,T) \quad \text{Equation 2}$$

The parameter R1 indicates the internal resistance [$\Omega$] of the subject cell 111. The R0(SOC, T) indicates the internal resistance [$\Omega$] of the cell 111 in the case of a new article. The parameter R1 can be calculated based on a ratio of a current change ($\Delta I=I2-I1$) during charging/discharging and a voltage change ($\Delta V=V2-V1$) as described in the following Equation 3.

[Mathematical Formula 3]

$$R1=\Delta V/\Delta I \quad \text{Equation 3}$$

A value of R0 may be stored in the memory unit 180 in advance as the data table according to the SOC and the temperature of the cell 111. A value of R0 corresponding to the SOC and the temperature during charging/discharging can be obtained through the following Equation 4. The battery state calculation unit 151 can obtain the SOH of the cell 111 by applying the values of R1 and R0 obtained through Equations 3 and 4 to Equation 2.

[Mathematical Formula 4]

$$R0=RMap(SOC(t),T(t)) \quad \text{Equation 4}$$

Further, the internal resistance installed on RMap in Equation 4 may be configured by using the internal resistance according to the definition of the SOH, or may be defined for the SOH calculation, or may be realized by utilizing RoMap to be described below.

First Embodiment: Method of Calculating Allowable Current

Since the both-end voltage of the cell 111 does not exceed an upper limit voltage or a lower limit voltage, the battery state calculation unit 151 calculates an allowable charge current and an allowable discharge current using the SOC, the SOH, the battery temperature of the cell 111 during charging/discharging. An allowable discharge current Idmax can be obtained through the following Equation 5a, and the allowable charge current can be obtained through the following 5b.

[Mathematical Formula 5]

$$Idmax=(OCVMap(SOC(t),T(t))-Vmin)/ \\ (RMap(SOC(t),T(t))\times SOH/100) \quad \text{Equation 5a}$$

$$Icmax=(Vmax-OCVMap(SOC(t),T(t)))/ \\ (RMap(SOC(t),T(t))\times SOH/100) \quad \text{Equation 5b}$$

The parameter OCVMap corresponds to the SOC table 181. The parameter RMap is the data table which describes the correspondence relation between the SOC, the temperature, and the internal resistance, and can be stored in the memory unit 180 in advance. The parameter RMap may be substituted by RoMap and RpMap to be described in the following Equation 6.

First Embodiment: Details of Parameter Calculation Unit 152

Figure 8:
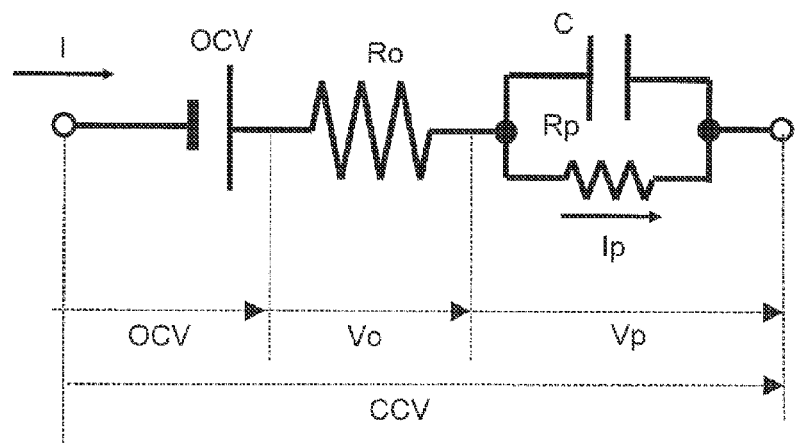
FIG. 8 is a diagram illustrating an equivalent circuit of the cell 111.

FIG. 8 is an equivalent circuit diagram of the cell 111. An equivalent circuit illustrated in FIG. 8 has a circuit configuration in which a DC power source simulating the open circuit voltage OCV of the battery, Ro indicating an electrical resistance of an element such as an electrode and an electrolyte, and a parallel circuit of Rp indicating a loss according to an electrochemical reaction of the battery and C being connected in series. The parameter calculation unit 152 can calculate the closed circuit voltage CCV in a case where the current I flowing into the equivalent circuit illustrated in FIG. 8 based on the following Equation 6.

[Mathematical Formula 6]

$$CCV(t)=OCV(t)+Vo(t)+Vp(t)$$

$$OCV(t)=OCVMap(SOC(t),T(t))$$

$$Vo(t)=I(t)\times RoMap(SOC(t),T(t))\times SOH/100$$

$$Vp(t)=Ip(t)\times RpMap(SOC(t),T(t))\times SOH/100 \quad \text{Equation 6}$$

The parameter OCVMap indicates a correspondence relation between the SOC and the temperature and the OCV of the cell 111, the parameters RoMap and RpMap are data tables describing a correspondence relation between the SOC and the temperature of the cell 111 and a correspondence relation between Ro and Rp, respectively. The parameter OCVMap may be stored in the memory unit 180 in advance. The parameter calculation unit 152 calculates the closed circuit voltage CCV (the model voltage) of the cell 111 based on Equation 6, and outputs the calculated CCV to the probability diagnosis unit 153. Further, the equivalent circuit illustrated in FIG. 8 is an example, and other equivalent circuits and the corresponding arithmetic equations may be employed.

First Embodiment: First Method of Diagnosing Probability of SOH

The probability diagnosis unit 153 diagnoses the probability of the SOH calculated by the parameter calculation unit 152 by comparing the both-end voltages (hereinafter, referred to as actual voltages) of the cell 111 transmitted from the cell control units 121*a* and 121*b* with the model voltage calculated by the parameter calculation unit 152. In this first embodiment, the probability is diagnosed by detecting a difference between the actual voltage and the model voltage. Hereinafter, the description will be made about a method of detecting a difference between the actual voltage and the model voltage.

Figure 9:
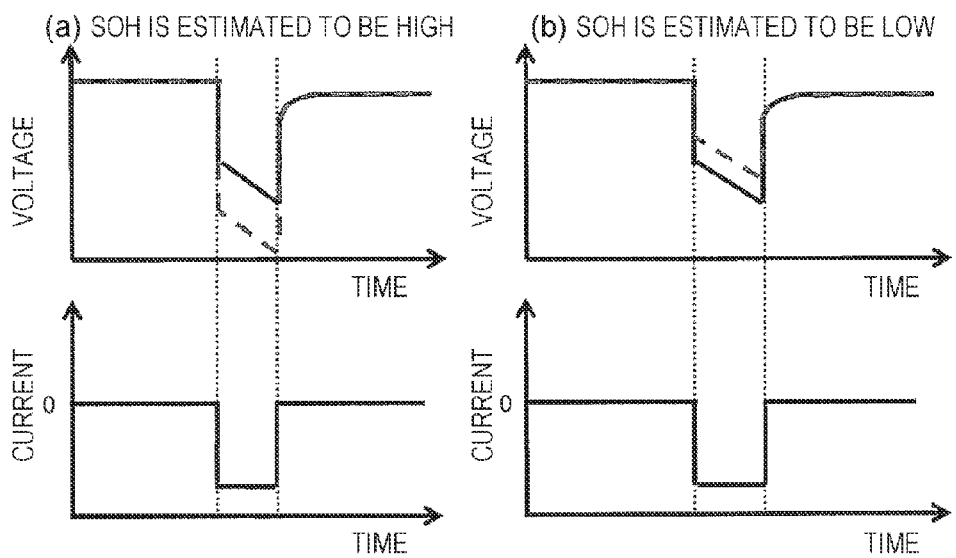
FIGS. 9(a) and 9(b) are diagrams illustrating a state where there is a difference between a model voltage and an actual voltage.

FIGS. 9(*a*) and 9(*b*) illustrate the states where there is a difference between the model voltage and the actual voltage, in which the current value is plotted with a negative value during the discharging and a positive value during the charging. Herein, the battery voltage during the discharging is exemplified. In a case where the SOH calculation result is not accurate and there is a displacement (error) between the actual SOH and the calculation result, a difference between the model voltage and the actual voltage is generated as illustrated in FIGS. 9(*a*) and 9(*b*) since the model voltage is calculated using the SOH.

FIG. 9(*a*) illustrates an error in a case where the SOH calculation result is higher than the actual SOH during the discharging. In this case, the model voltage becomes lower than the actual voltage. FIG. 9(*b*) illustrates an error in a case where the SOH calculation result is lower than the actual SOH during the discharging. In this case, the model voltage becomes higher than the actual voltage. Further, the magnitude relation between the voltages during the discharging is illustrated in FIGS. 9(*a*) and 9(*b*), but the magnitude relation between the actual voltage and the model voltage during the charging is inverted to FIGS. 9(*a*) and 9(*b*).

In a case where the difference between the actual voltage and the model voltage is equal to or more than a predetermined threshold, the probability diagnosis unit 153 can diagnose that the calculation accuracy of the SOH calculated by the parameter calculation unit 152 is low. The probability diagnosis unit 153 outputs a warning signal indicating the result to a host device (for example, the vehicle control unit 200). The host device lights on, for example, a warning lamp to urge a user to request a repair of the vehicle such as replacing the battery. The warning issued by the probability diagnosis unit 153 is also the same in the following example.

First Embodiment: Second Method of Diagnosing Probability of SOH

Figure 10:
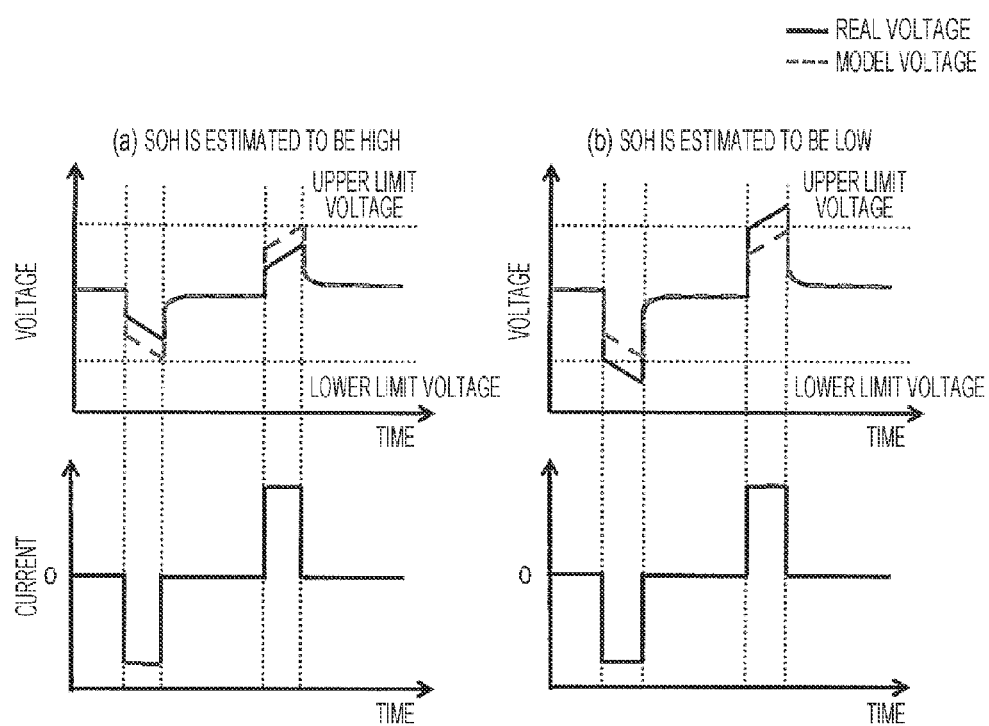
FIGS. 10(a) and 10(b) are diagrams for describing another method of a probability diagnosis unit 153 to diagnose a probability of an SOH calculation result.

FIGS. 10(*a*) and 10(*b*) are diagrams for describing another method of the probability diagnosis unit 153 to diagnose the probability of the SOH calculation result. FIGS. 10(*a*) and 10(*b*) pay attention to the actual voltage in a case where the allowable charge current calculated by the battery state calculation unit 151 or the current corresponding to the allowable discharge current flows. The actual voltage when the allowable charge current or the allowable discharge current flows is assumed to be defined in a storage device such as an internal register of the probability diagnosis unit 153 in advance as the upper limit voltage or the lower limit voltage which is allowed as the both-end voltage of the cell 111.

In a case where the SOH is accurately calculated, when a current corresponding to the allowable charge current or the allowable discharge current flows, the actual voltage comes to be just matched with the upper limit voltage or the lower limit voltage. However, in a case where the SOH is calculated to be larger than the real value, the value of the allowable charge current or the allowable discharge current shown in Equation 5 becomes smaller. Therefore, when the current corresponding to the allowable charge current or the allowable discharge current flows, the actual voltage does not reach the upper limit voltage or the lower limit voltage as illustrated in FIG. 10(*a*), and the voltage dynamic range at the time of charging/discharging becomes smaller than the actual value. In a case where the SOH is calculated to be smaller than the real value, the value of the allowable charge current or the allowable discharge current shown in Equation 5 becomes larger. Therefore, when the current corresponding to the allowable charge current or the allowable discharge current flows, the actual voltage becomes larger than the upper limit voltage or smaller than the lower limit voltage as illustrated in FIG. 10(*b*), and the voltage dynamic range at the time of charging/discharging becomes larger than the actual value.

The probability diagnosis unit 153 can diagnose the probability of the SOH calculation result by detecting the phenomenon illustrated in FIGS. 10(*a*) and 10(*b*). Specifically, when the model voltage is a value corresponding to the allowable charge current or the allowable discharge current, the probability of the SOH calculation result can be diagnosed by the result of whether the actual voltage reaches the upper or lower limit voltage.

First Embodiment: Third Method of Diagnosing Probability of SOH

The diagnosis methods described in FIGS. 9(*a*) to 10(*b*) are preferably performed, for example, when the vehicle starts up under the condition that there is a minor influence of heating generated in the cell 111 according to charging/discharging. The reason will be described below using FIG. 11.

Figure 11:
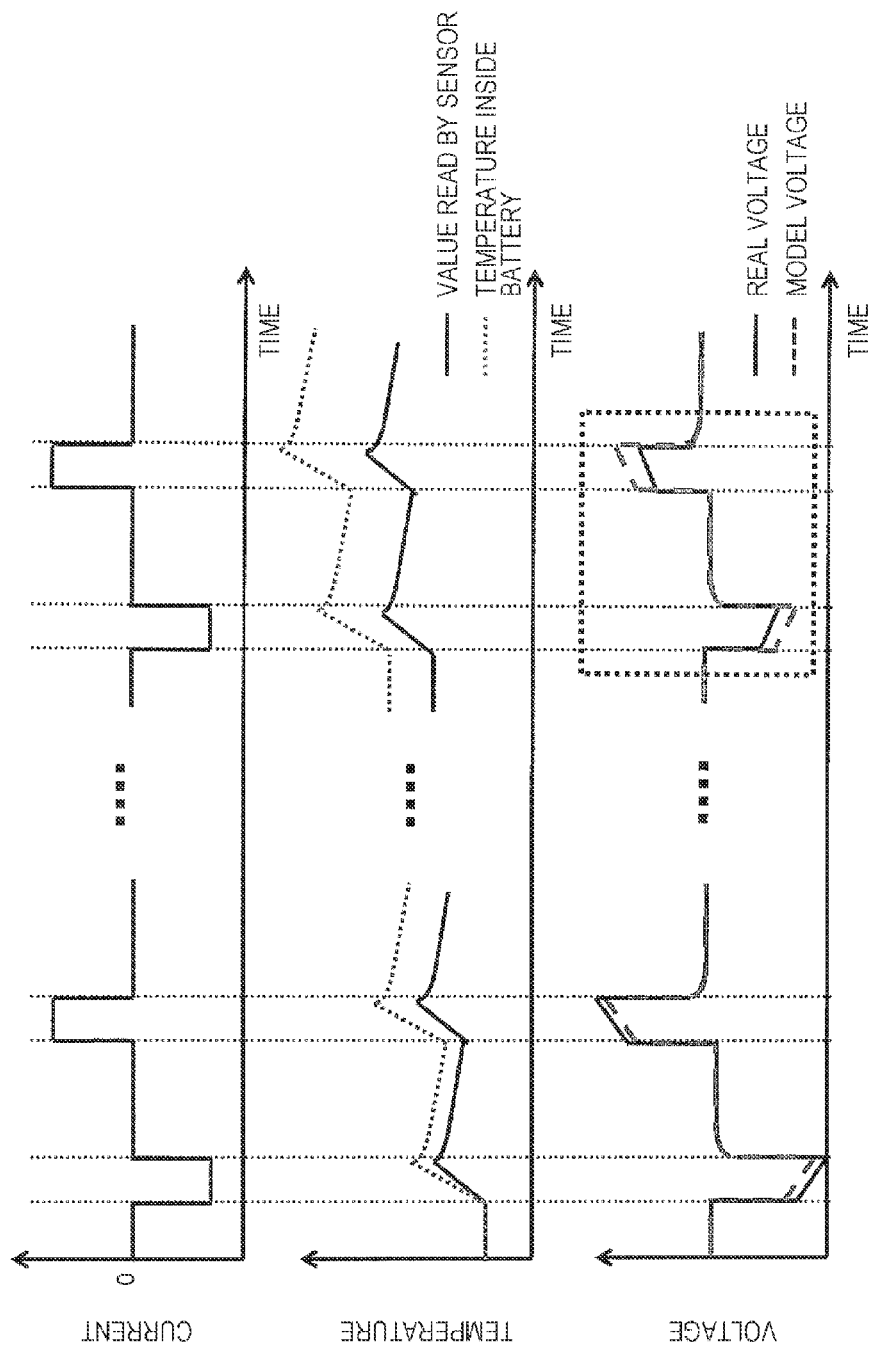
FIG. 11 is a diagram illustrating changes of a both-end voltage and a temperature of the cell 111 according to charging/discharging.

FIG. 11 is a diagram illustrating changes of the both-end voltage and the temperature of the cell 111 according to charging/discharging. The upper portion of FIG. 11 illustrates a change in the battery current. The intermediate portion of FIG. 11 illustrates a change in a battery temperature, in which the dotted line indicates a detection value of the temperature detection unit 125 and the solid line indicates an internal temperature of the cell 111. The lower portion of FIG. 11 illustrates the both-end voltage of the cell 111, in which the dotted line indicates the model voltage and the solid line indicates the actual voltage.

The cell 111 is heated according to charging/discharging and increased in temperature. At this time, the temperature in the cell 111 is differently distributed such that the temperature inside the cell 111 is high and as it is closer to the surface, the temperature of the surface becomes lower. The temperature that the temperature detection unit 125 acquires is the temperature at the surface of the cell 111, not the temperature inside the cell 111. Therefore, a temperature difference between the inside and the surface is generated, thereby causing an error in the calculation result.

The internal resistance values (RMap, RoMap, and RpMap) of the cell 111 used in Equations 5 and 6 are determined based on the detection result of the temperature detection unit 152. The value acquired by the temperature detection unit 152 becomes lower than the internal temperature of the cell 111. In general, the internal resistance of the battery tends to be increased as the temperature is lowered. Therefore, when the internal resistance is determined based on the information of the temperature detection unit 152, an estimated internal resistance value becomes higher. For this reason, in a case where a temperature becomes different between the inside and the surface of the battery as the charging or the discharging proceeds, even when the SOH calculation result is correct, the model voltage of Equation 5 is calculated to be higher than the actual voltage at the time of charging and calculated to be lower than the actual voltage at the time of discharging as illustrated in FIGS. 10(a) and 10(b). Therefore, the diagnosis method described in FIGS. 9(a) to 10(b) is preferably performed under the condition that there is a minor influence of heating generated in the cell 111.

Figure 12:
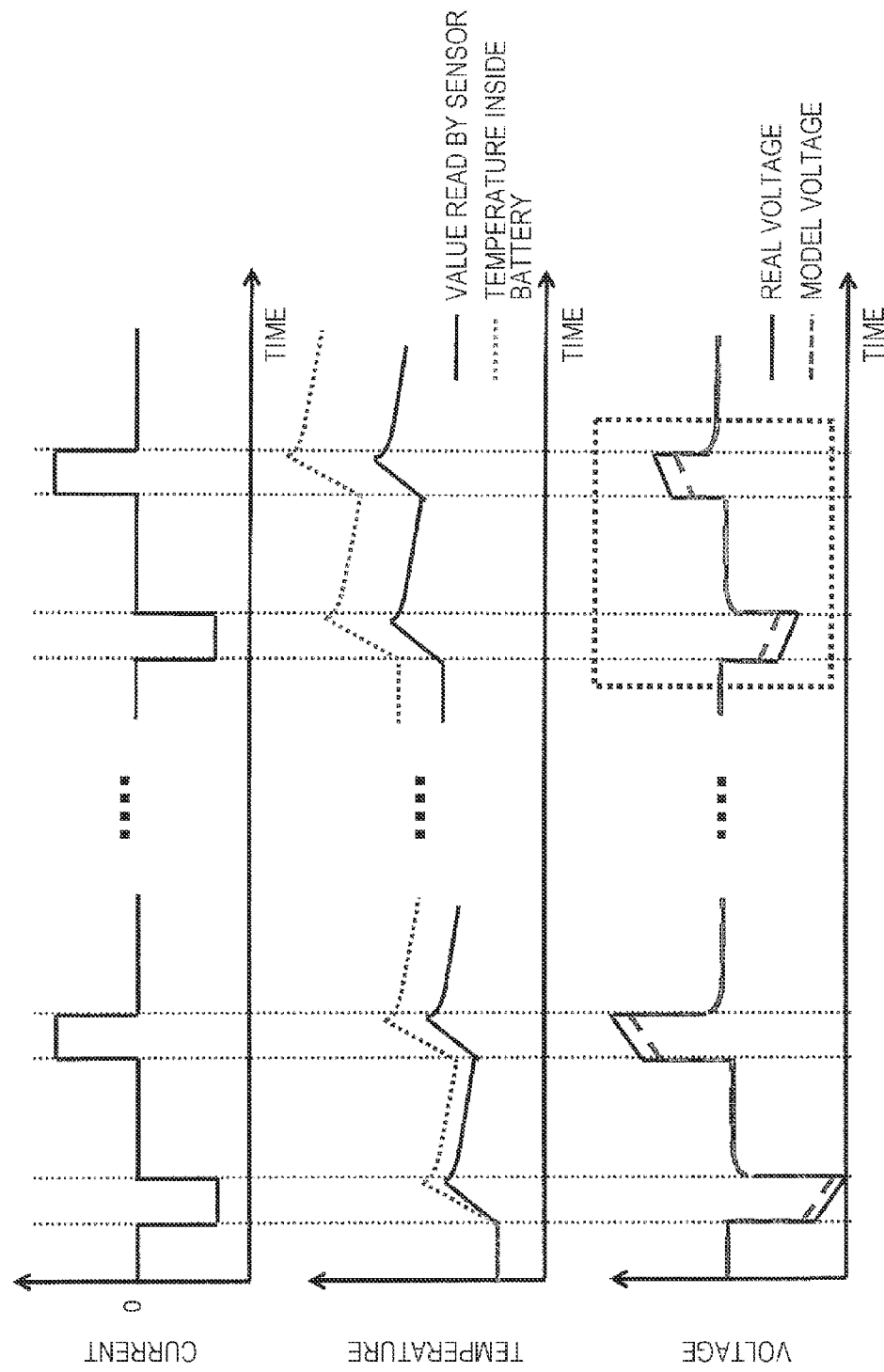
FIG. 12 is a diagram illustrating changes of a both-end voltage and a temperature of the cell 111 in a case where the SOH is calculated as a value smaller than the real value.

Herein, a case where the SOH is calculated to be smaller than the real value is considered. FIG. 12 is a diagram illustrating changes of the both-end voltage and the temperature of the cell 111 in a case where the SOH is calculated to be smaller than the real value. Even when the method described in FIGS. 9(a) to 10(b) is not suitable to be performed and the influence of heating generated in the cell 111 is large, in a case where the magnitude relation between the model voltage and the actual voltage at the time of charging/discharging is inverted to FIG. 11 which is inherently possible as illustrated in FIG. 12 (that is, a case where the model voltage of the cell 111 is lower than the actual voltage), it is possible to determine that the SOH calculation result is estimated to be small. Therefore, in a case where the phenomenon illustrated in FIG. 12 is detected, the probability diagnosis unit 153 can diagnose the probability of the SOH calculation result even on an undesirable condition for performing the method described in FIGS. 9(a) to 10(b).

First Embodiment: Conclusion

As described above, the battery system 100 according to this first embodiment can diagnose the probability of the SOH calculation result by comparing the model voltage calculated using the SOC and SOH calculation results with the actual voltage. Therefore, it is possible to secure reliability of the battery system 100.

In this first embodiment, the description has been made about the method of diagnosing the probability of the SOH by comparing a CCV calculation value with the actual voltage based on Equation 6. However, a voltage change $\Delta V(t)=I(t)\times RMap(SOC(t), T(t))$ in a case where a current is made to flow instead of the CCV is calculated, and the calculated voltage change is compared with the voltage change of the actual voltage, so that the probability of the SOH can be diagnosed.

Second Embodiment

In FIGS. 9(a) to 12 of the first embodiment, the description has been made about that the probability of the SOH is diagnosed, and the probability of the SOC can be diagnosed through the same method. In a second embodiment of the invention, a method of diagnosing the probability of the SOC will be described. The configuration of the battery system 100 is the same as that of the first embodiment.

Figure 13:
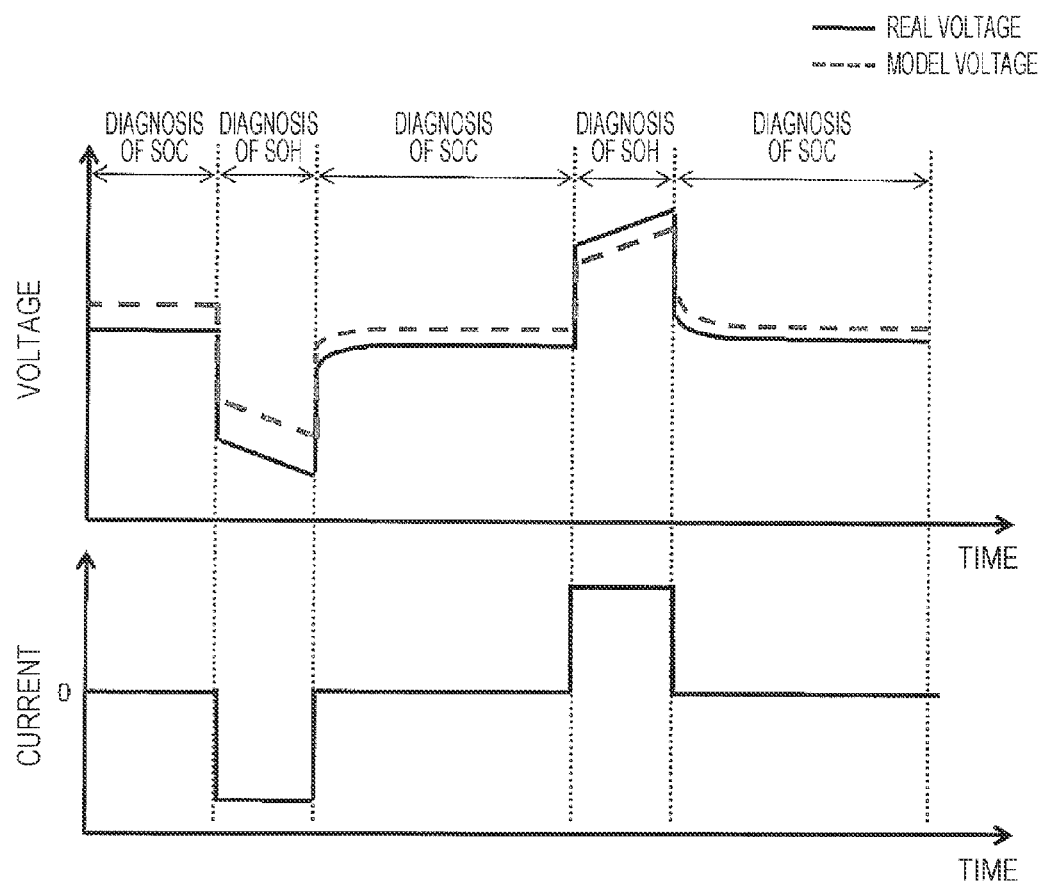
FIG. 13 is a diagram illustrating changes of a both-end voltage and a battery current according to charging/discharging of the battery.

FIG. 13 is a diagram illustrating changes of the both-end voltage and the battery current according to charging/discharging of the battery. As illustrated in FIG. 13, when the battery current does not flow, or the battery current is weak and the both-end voltage of the battery falls within a range considered as equivalent as the OCV, the model voltage expressed by Equation 6 can be considered as the OCV. Then, in this second embodiment, the probability diagnosis unit 153 converts the SOC calculated based on Equation 1 into the OCV based on the SOC table 181, and compares the OCV with the model voltage so as to diagnose the probability of the SOC. For example, in a case where a difference between the OCV and the model voltage is equal to or more than a predetermined threshold, it is possible to determine that the SOC is not correct.

The SOC diagnosis described above is necessarily performed in a period when it is considered that there is no battery current. Therefore, the period to diagnose the probability of the SOC becomes a period when the cell 111 is not in charging/discharging as illustrated in FIG. 13. In the period when the cell 111 is in charging/discharging, the probability of the SOH is diagnosed as described in the first embodiment. Therefore, it is possible to diagnose the SOC and the SOH in a cycle of the charging and the discharging.

Third Embodiment

In the first embodiment, the description has been made about the method of diagnosing the probability of the SOH by comparing the model voltage with the actual voltage. In a third embodiment of the invention, the description will be made about a method of diagnosing the probability of the SOH by comparing an actual temperature of the cell 111 with an estimated value.

Figure 14:
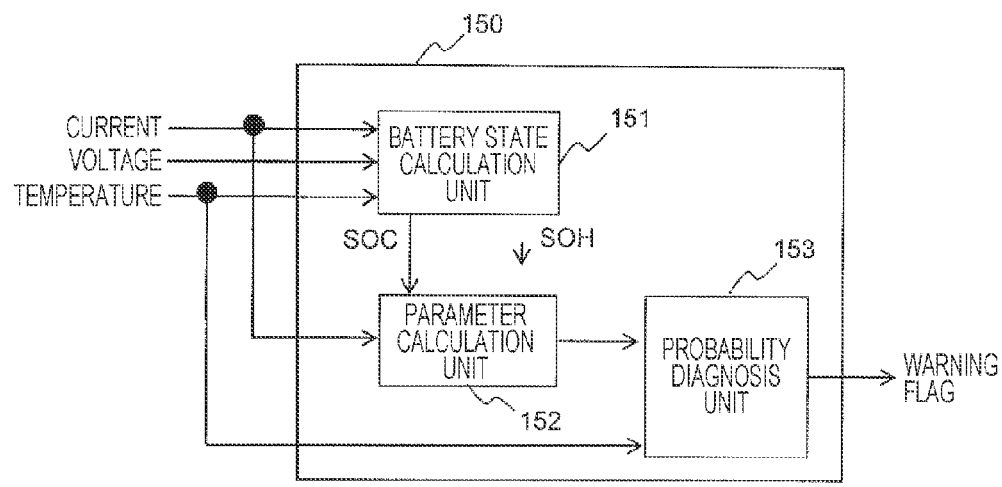
FIG. 14 is a control block diagram of an assembled battery control unit 150 in a third embodiment.

FIG. 14 is a control block diagram of the assembled battery control unit 150 in this third embodiment. The configurations of the assembled battery control unit 150 are the same as those of the first and second embodiments, but the input parameters of the units are different. The other configurations are the same those of the first and second embodiments.

The function of the battery state calculation unit 151 is the same as that described in the first embodiment. The parameter calculation unit 152 calculates the internal temperature of the current cell 111 based on the battery current value output by the current detection unit 130 and the SOC calculation result and the SOH calculation result output by the battery state calculation unit 151, and outputs the calculation result to the probability diagnosis unit 153. The probability diagnosis unit 153 diagnoses the probability of the SOH calculation result by comparing a temperature calculation value calculated by the parameter calculation unit 152 with the battery temperature (actual temperature) output by the cell management unit 120.

Third Embodiment: Method of Obtaining Temperature Calculation Value of Cell 111

The parameter calculation unit 152 may calculate the temperature T(t) of the cell 111 based on the following Equation 7. The calculation corresponds to a calculation of the temperature T(t) by accumulating Joule's heat generated by the internal resistance of the cell 111.

[Mathematical Formula 7]

$$T(t)=T0+\Sigma(Qp(t)+Qs(t)-Qb(t))/HC \qquad \text{Equation 7}$$

The parameter T(t) indicates a temperature calculation value [° C.], the parameter Qp(t) indicates Joules' heat [J] generated in a case where the current flows in the internal resistance of the battery, the parameter Qs(t) indicates a quantity of heat [J] according to an electrochemical reaction of the battery, the parameter Qb(t) indicates a quantity of radiation [J] based on a difference between the ambient temperature and the battery temperature, and the parameter HC indicates a capacity of heat [J/K]. The parameters Qp(t), Qs(t), and Qb(t) are respectively expressed by the following Equation 8.

[Mathematical Formula 8]

$$Qp(t)=RMap(SOC(t-1),T(t-1))\times SOH/100\times I(t)^2$$

$$Qs(t)=T(t-1)\times \Delta S(SOC(t-1),T(t-1))\times I(t)/F$$

$$Qb(t)=HTC\times Acell\times(T(t-1)-Tamb) \qquad \text{Equation 8}$$

The parameter $\Delta S$ indicates an entropy variation [J/mol/K], the parameter F indicates a Faraday constant [C/mol], the parameter HTC indicates a heat transfer coefficient [J/K/m^2], the parameter Acell indicates a surface area of the battery [m^2], and the parameter Tamb indicates an ambient temperature [° C.].

Third Embodiment: Method of Obtaining Actual Temperature of Cell 111

The parameter calculation unit 152 necessarily calculates the temperature of the cell 111 using the SOC and the SOH, and measures the actual temperature of the cell 111 for the comparison. However, since the temperature in the cell 111 is differently distributed during charging/discharging, the temperature detection unit 125 measuring the surface temperature of the cell 111 may fail to acquire an accurate battery temperature (actual temperature) of the cell 111. In addition, since the temperature in the assembled battery 110 is differently distributed during charging/discharging, the temperature becomes different in each cell 111. Therefore, temperature information of each cell 111 is required in order to correctly diagnose the probability of the SOH calculation result according to the temperature. As the simplest way, the temperature detection unit 125 may be provided in each cell 111, but it costs a lot. Further, when such a configuration is employed, the parameter calculation unit 153 necessarily obtains the temperature calculation value based on a high-precision calculation model in consideration of an influence on the temperature distribution in the battery system 100 and an influence on the temperature distribution in the cell 111. Therefore, it is difficult to diagnose the probability simply by comparing the temperature calculated by Equation 7 with the measured temperature value of the temperature detection unit 125.

This third embodiment pays attention on that a current-voltage pattern of the cell 111 is substantially constant at the time of charging by the charger 420. A charge profile (for example, a temperature at the time when the charging is ended, or an increased temperature value) according to the SOC, the SOH, and the temperature at the time when the charging starts is measured in advance, and the charge profile is stored in a database in a format such as table data. At the time of the actual charging, the charge profile (for example, the temperature at the time when the charging is ended, or the increased temperature value) corresponding to the SOC and the SOH at the time when the charging starts and the temperature for each cell group 112 acquired from the temperature detection unit 125 is read out of the database, so that the actual temperature of each cell 111 can be indirectly obtained.

Third Embodiment: Method of Diagnosing Probability of SOH

The probability diagnosis unit 153 diagnoses the probability of the SOH calculation result contained in Equation 7 by comparing the temperature (hereinafter, the actual temperature) read out of the database of the charge profile according to the SOC, the SOH, and the temperature at the time of the charging in advance with the temperature calculation value calculated by the parameter calculation unit 152. In this third embodiment, the diagnosis is performed by detecting a difference between the actual temperature and the temperature calculation value. Hereinafter, the description will be made about a method of detecting the difference between the actual temperature and the temperature calculation value.

Figure 15:
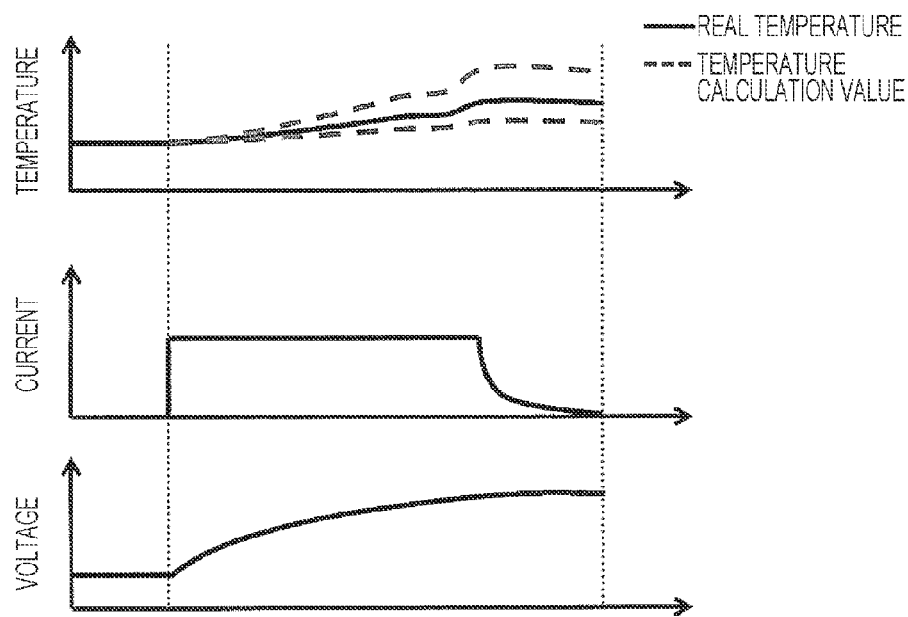
FIG. 15 is a diagram illustrating waveforms of a current, a voltage, and a temperature during the charging by a charger 420.

FIG. 15 is a diagram illustrating waveforms of the current, the voltage, and the temperature during the charging by the charger 420. Herein, a constant current-constant voltage (CC-CV) charging is exemplified in which the charging is performed with a constant current until the battery voltage reaches a target level and then the charging is performed while keeping a battery voltage constant. As other charging methods, there is a constant power-constant voltage (CP-CV) charging in which the charging is performed with a constant power until the battery voltage reaches a predetermined voltage and then the battery voltage is kept constant.

As illustrated in FIG. 15, the temperature of the cell 111 is increased by the influence of heating during the charging. In a case where the SOH calculation result contained in Equation 7 is not accurate, there occurs a displacement (error) between the temperature calculation value calculated by Equation 7 and the actual temperature.

In a case where the SOH calculation result is lower than the real value, the calculation result of Qp(t) of Equation 8 is smaller than the real value, so that the temperature calculation result becomes smaller than the actual temperature. In a case where the calculation result of Qp(t) is larger than the real value, the calculation result of Qp(t) becomes larger than the real value, the temperature calculation result becomes larger than the actual temperature. In other words, since the influence of the error contained in the SOH calculation result is reflected on the temperature calculation value, the probability of the SOH calculation result can be diagnosed by comparing the actual temperature with the temperature calculation value. Specifically, in a case where the difference is equal to or more than a predetermined threshold, it can be diagnosed that the SOH calculation result is deviated from the real value.

Third Embodiment: Conclusion

As described above, the battery system 100 according to this third embodiment can diagnose the probability of the SOH calculation result based on the battery temperature calculated using the calculation result of the SOC and the SOH and the actual temperature.

Fourth Embodiment

In the first to third embodiments, the probability diagnosis unit 153 has been described to issue a warning according to the diagnosis result, but does not inform about the cause of the diagnosis result. In a fourth embodiment of the invention, the description will be made about an example in which a notification is made in a case where the SOH (or SOC) calculation result becomes incorrect due to displacement in simultaneity of measurement timing. The configuration of the battery system 100 is similar to those of the first to third embodiments.

Figure 16:
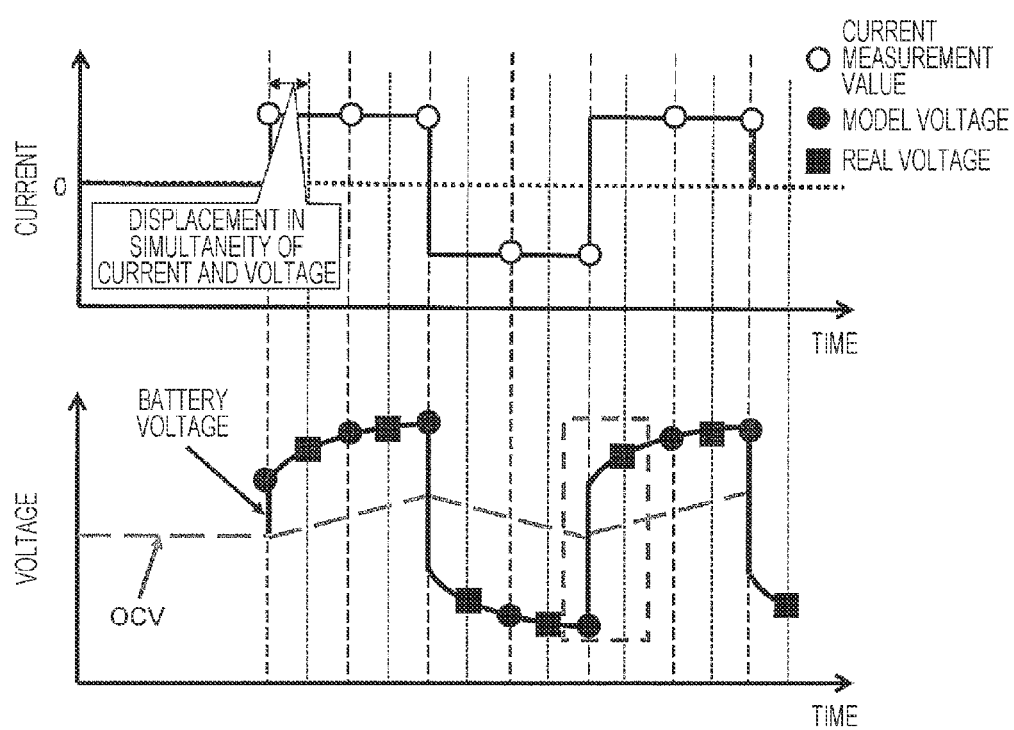
FIG. 16 is a diagram illustrating changes of a current and a both-end voltage of the battery according to charging/discharging of the cell 111.

FIG. 16 is a diagram illustrating changes of the battery current and the both-end voltage of the battery according to charging/discharging of the cell 111. In the upper portion of FIG. 16, the current detection unit 130 detects the battery current at the timings depicted with a white circle. In the lower portion of FIG. 16, the voltage detection unit 140 detects the both-end voltage of the battery at the timings depicted with a black rectangular. Since the model voltage is calculated according to the detected current, the timings of the model voltage are equal to the timings of detecting the battery current which are depicted with a black circle of the lower portion of FIG. 16. Therefore, there occurs a displacement between the timing of the model voltage and the timing of the actual voltage as illustrated in the lower portion of FIG. 16.

As illustrated in FIG. 16, when a displacement occurs in the timings of detecting the current and the voltage, the probability diagnosis unit 153 may be significantly deviated between the model voltage and the actual voltage when being compared. For example, as illustrated with a dotted line in the lower portion of FIG. 16, when the model voltage and the actual voltage are acquired before and after charging/discharging is performed by chance, the model voltage and the actual voltage are significantly deviated. Therefore, the probability diagnosis unit 153 diagnoses that the SOH (or SOC) calculation result is not precise. Since the diagnosis result shows that the probability of the SOH is different from the intended probability, it is considered that it is desirable that the situation causing the diagnosis result is specified and notified to the user.

Referring to a portion depicted with the dotted line in the lower portion of FIG. 16, the model voltage (black circle) in the first half portion is smaller than the OCV, and the actual voltage (black rectangular) in the second half portion is larger than the OCV. In the other sections, between the model voltage and the magnitude relation of the OCV, and the magnitude relation between the actual voltage and the OCV are not changed. In other words, the cause of the inversion in these magnitude relations is attributable to the displacement between the timing of measuring the battery current and the timing of measuring the actual voltage at the time when the charging and the discharging are switched.

Therefore, in a case where the magnitude relation is inverted as described above, the probability diagnosis unit 153 can notify the host device (for example, the vehicle control unit 200) of the situation that the SOH calculation result is diagnosed as incorrect due to the displacement at the measurement timing as described above, for example, using a notification signal indicating that situation. Therefore, the user can take action such as making sure of whether the warning continues while suspending the replacement of the cell.

Fourth Embodiment: Conclusion

As described above, the battery system 100 according to this fourth embodiment determines the cause of the diagnosis result on the probability of the SOH calculation result based on whether the magnitude relation between the model voltage and the OCV and the magnitude relation between the actual voltage and the OCV are inverted. Therefore, it is possible to notify the user of the diagnosis result causing the displacement in simultaneity of measurement timing so as to urge the user to take appropriate action.

The invention is not limited to the above embodiments, and various modifications can be made. The embodiments are to describe the invention in detail to help with understanding, but it is not essential that all the configurations are necessarily provided. In addition, some of configurations of a certain embodiment may be replaced into the configuration of another embodiment. In addition, the configuration of a certain embodiment may be added to another embodiment. In addition, additions, omissions, and substitutions can be made on some of the configurations of each embodiment with other configurations.

For example, the descriptions in the first to fourth embodiments have been made about the plurality of methods of diagnosing the SOH calculation result, and the final diagnosis result may be obtained by taking a weighted average on the results acquired through the respective diagnosis methods. Alternatively, as described in FIG. 12 and the second embodiment, other diagnosis methods may be alternatively employed in a period not suitable for a specific diagnosis method.

Some or all of the configurations, functions, processing units, and processing sections may be realized with hardware, for example, using an integrated circuit. In addition, the configurations and the functions may be realized with software by interpreting and executing a program for realizing the respective functions by a processor. Information such as programs for realizing the respective functions, tables, and files may be stored in a recording medium such as a storage device (for example, a memory, a hard disk, and a solid state drive (SSD)), an IC card, and SD card, and a DVD.

REFERENCE SIGNS LIST 100 battery system
110 assembled battery
111 cell
112 cell group
120 cell management unit
121 cell control unit
122 voltage detection circuit
123 control circuit
124 signal input/output circuit
125 temperature detection unit
130 current detection unit
140 voltage detection unit
150 assembled battery control unit
151 battery state calculation unit
152 parameter calculation unit
153 probability diagnosis unit
160 signal communication unit
170 insulation element
180 memory unit
200 vehicle control unit
300 to 330 relay
400 inverter
410 motor generator
420 charger

The invention claimed is:

1. A battery control system, comprising:
a voltage sensor that measures a both-end voltage of a battery;
a current sensor that measures a current flowing in the battery; and
a battery controller communicatively coupled to the voltage sensor and the current sensor;
wherein the battery controller:
calculates a state of charge and a state of health of the battery;
calculates a modeled both-end voltage based on the current flowing in the battery, the state of charge and the state of health of the battery; and
determines a probability of the state of charge and the state of health of the battery by comparing the both-end voltage of the battery and the modeled both-end voltage,
outputs a diagnosis result based on the probability of the state of charge;
wherein:
when the battery is discharging, the state of health of the battery is calculated to be small in a case where the modeled both-end voltage of the battery is larger than the both-end voltage of the battery detected by a predetermined threshold or more, and
when the battery is discharging, the state of health of the battery is calculated to be large in a case where the modeled both-end voltage is smaller than the both-end voltage by the predetermined threshold or more, and when the battery is charging, the state of health of the battery is calculated to be large in a case where the modeled both-end voltage is larger than the both-end voltage by the predetermined threshold or more, and when the battery is charging, the state of health of the battery is calculated to be small in a case where the modeled both-end voltage of the battery is smaller than the both-end voltage by the predetermined threshold or more.

2. The battery control system according to claim 1, further comprising:

wherein the battery controller further determines the probability of the state of charge and the state of health of the battery calculated by comparing a resultant both-end voltage of the battery in a case where an allowable charge current or an allowable discharge current flows in the battery with the both-end voltage in a case where the allowable charge current or the allowable discharge current flows in the battery.

3. The battery control system according to claim 2, wherein:

the state of health of the battery is calculated to be small in a case where a variation amount of the both-end voltage of the battery exceeds a variation amount of the modeled both-end voltage by a predetermined threshold and the state of health of the battery is calculated to be large in a case where the variation amount of the both-end voltage of the battery is lower than the variation amount of the modeled both-end voltage.

4. The battery control system according to claim 1, wherein:

the state of health of the battery is calculated to be small in a case where the modeled both-end voltage is smaller than the both-end voltage when the battery is charged or discharged.

5. The battery control system controller according to claim 1, wherein the battery controllers determine the probability of the state of charge of the battery in a case where the current does not flow in the battery, or the current flowing in the battery is equal to or less than a predetermined threshold so as to be considered as no current flowing in the battery, and determines the probability of the state of health of the battery in a case where the battery is charged or discharged.

6. The battery controller according to claim 1, further comprising a temperature sensor that measures an internal temperature of the battery, wherein the battery controller further:

calculates a modeled internal temperature of the battery using the state of charge and the state of health of the battery, and determines the probability of the state of charge or the state of health of the battery by comparing the modeled internal temperature of the battery with the internal temperature of the battery.

7. The battery control system according to claim 6, wherein:

the state of health of the battery is calculated to be large in a case where the modeled internal temperature is larger than the internal temperature by a predetermined threshold or more, and the state of health of the battery is calculated to be small in a case where the modeled internal temperature of the battery calculated is smaller than the internal temperature by the predetermined threshold or more.

8. The battery control system according to claim 1, wherein the battery controller further in a case where the state of charge or the state of health of the battery is not correct, acquires a first magnitude relation indicating a larger one of the modeled both-end voltage and an open circuit voltage of the battery, and a second magnitude relation indicating a larger one of the both-end voltage of the battery and the open circuit voltage of the battery, and determines that the state of charge or the state of health of the battery is incorrect based on a displacement between a detection timing of the current sensor and a detection timing of the voltage sensor in a case where the magnitude relation indicated by the first magnitude relation is inverted to the magnitude relation indicated by the second magnitude relation.

* * * * *